United States Patent
Chen et al.

(10) Patent No.: US 11,859,917 B2
(45) Date of Patent: Jan. 2, 2024

(54) HEAT EXCHANGER, CABINET, AND COMMUNICATIONS BASE STATION

(71) Applicant: Huawei Digital Power Technologies Co., Ltd., Shenzhen (CN)

(72) Inventors: Jun Chen, Dongguan (CN); Xiaowei Hui, Dongguan (CN); Zhisheng Lian, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/710,481

(22) Filed: Mar. 31, 2022

(65) Prior Publication Data

US 2022/0316806 A1 Oct. 6, 2022

(30) Foreign Application Priority Data

Mar. 31, 2021 (CN) .......................... 202110350896.6

(51) Int. Cl.
*F28D 7/16* (2006.01)
*H04Q 1/02* (2006.01)

(52) U.S. Cl.
CPC ............... *F28D 7/16* (2013.01); *H04Q 1/035* (2013.01); *H04Q 2201/808* (2013.01)

(58) Field of Classification Search
CPC ........ F28D 7/16; F28D 7/1615; F28D 7/1623; H04Q 1/035; H04Q 2201/808
USPC ....................................................... 165/80.4
See application file for complete search history.

(56) References Cited

U.S. PATENT DOCUMENTS

| 6,006,824 | A | * | 12/1999 | Hattori | ..................... F28D 7/16 165/161 |
|---|---|---|---|---|---|
| 6,745,828 | B1 | | 6/2004 | Lehman | |
| 6,761,212 | B2 | | 7/2004 | Dipaolo | |
| 7,004,239 | B2 | | 2/2006 | Osakabe et al. | |
| 9,007,771 | B2 | | 4/2015 | Agostini | |
| 9,032,743 | B2 | | 5/2015 | Agostini et al. | |
| 10,634,434 | B2 | | 4/2020 | Laurila et al. | |
| 10,989,483 | B2 | * | 4/2021 | Espersen | ............... F28D 15/043 |
| 2007/0284093 | A1 | * | 12/2007 | Bhatti | ................. F28D 15/0233 165/104.33 |
| 2011/0094257 | A1 | | 4/2011 | Rusignuolo et al. | |
| 2012/0285003 | A1 | | 11/2012 | Ekstedt et al. | |

(Continued)

FOREIGN PATENT DOCUMENTS

| CN | 101556121 A | 10/2009 |
|---|---|---|
| CN | 201503231 U | 6/2010 |

(Continued)

*Primary Examiner* — Jianying C Atkisson
*Assistant Examiner* — Raheena R Malik
(74) *Attorney, Agent, or Firm* — Leydig, Voit & Mayer, Ltd.

(57) ABSTRACT

A heat exchanger includes a vapor collection pipe, a liquid collection pipe, and an exchange pipeline. The exchange pipeline includes a condensing section, an evaporation section, and a transition section. An upper end of the condensing section is connected to the vapor collection pipe. A lower end of the condensing section is connected to a first end of the transition section. An upper end of the evaporation section is connected to a second end of the transition section. A lower end of the evaporation section is connected to the liquid collection pipe. The evaporation section and the condensing section respectively extend in directions opposite to each other.

19 Claims, 13 Drawing Sheets

(56) References Cited

U.S. PATENT DOCUMENTS

| | | | |
|---|---|---|---|
| 2014/0366571 A1 | 12/2014 | Gao et al. | |
| 2018/0038653 A1* | 2/2018 | Espersen | F28D 15/043 |
| 2019/0113287 A1 | 4/2019 | Hachiya et al. | |
| 2019/0212061 A1* | 7/2019 | Jin | F25B 39/02 |
| 2020/0088471 A1 | 3/2020 | Omi et al. | |
| 2021/0041180 A1 | 2/2021 | Chen et al. | |

FOREIGN PATENT DOCUMENTS

| | | |
|---|---|---|
| CN | 101819000 A | 9/2010 |
| CN | 201621999 U | 11/2010 |
| CN | 102607304 A | 7/2012 |
| CN | 202692464 U | 1/2013 |
| CN | 205717833 U | 11/2016 |
| CN | 206073776 U | 4/2017 |
| CN | 106610240 A | 5/2017 |
| CN | 106654430 A | 5/2017 |
| CN | 106918166 A | 7/2017 |
| CN | 107548447 A | 1/2018 |
| CN | 108469193 A | 8/2018 |
| CN | 109640577 A | 4/2019 |
| CN | 110753822 A | 2/2020 |
| CN | 111664733 A | 9/2020 |
| CN | 111854180 A | 10/2020 |
| CN | 112524986 A | 3/2021 |
| CN | 212658104 U | 3/2021 |
| CN | 202110350896.6 | 7/2023 |
| EP | 2625484 B1 | 6/2019 |
| JP | H10227554 A | 8/1998 |
| JP | 2008303728 A | 12/2008 |
| JP | 2020106206 A | 7/2020 |
| WO | 9708483 A2 | 3/1997 |
| WO | 2020152738 A1 | 7/2020 |

\* cited by examiner

HEAT EXCHANGER, CABINET, AND COMMUNICATIONS BASE STATION

CROSS-REFERENCE TO RELATED APPLICATION

This application claims priority to Chinese Patent Application No. 202110350896.6, filed on Mar. 31, 2021, which is hereby incorporated by reference in its entirety.

TECHNICAL FIELD

This application belongs to the field of heat exchange device technologies, and in particular, to a heat exchanger, a cabinet, and a communications base station.

BACKGROUND

A heat exchanger is an apparatus configured to transfer heat from a hot fluid to a cold fluid to meet a heat exchange requirement. The heat exchanger is usually used as an important heat dissipation apparatus applied in an industrial device. For example, the heat exchanger exists in an outdoor cabinet of a communications base station, to transfer heat generated in the outdoor cabinet to the outside of the cabinet.

In the existing technologies, the heat exchanger generally includes an evaporator and a condenser. The evaporator and the condenser are independent components. A connection pipeline needs to be disposed between the evaporator and the condenser to implement mutual connection. Therefore, when the heat exchanger is manufactured, the evaporator and the condenser need to be first separately manufactured, and then the connection pipeline needs to be welded between the evaporator and the condenser. As a result, the heat exchanger has high manufacturing costs and low manufacturing efficiency.

SUMMARY

Embodiments of this application provide a heat exchanger, a cabinet, and a communications base station, which resolve a technical problem in the conventional technologies that a heat exchanger has high manufacturing costs and low manufacturing efficiency.

Technical solutions discussed in this application include the following aspects.

According to a first aspect, a heat exchanger is provided, including:

a vapor collection pipe, disposed in a cold environment;

a liquid collection pipe, disposed in a hot environment; and an exchange pipeline, including a condensing section located in the cold environment, an evaporation section located in the hot environment, and a transition section located in a junction part between the hot environment and the cold environment.

An upper end of the condensing section is connected to the vapor collection pipe. A lower end of the condensing section is connected to a first end of the transition section.

An upper end of the evaporation section is connected to a second end of the transition section relative to the first end. A lower end of the evaporation section is connected to the liquid collection pipe.

The evaporation section and the condensing section respectively extend in directions opposite to each other. An included angle between an axis of the evaporation section and an axis of the transition section meets the following relationship:

$60° \leq \theta_1 < 180°$.

An included angle between an axis of the condensing section and the axis of the transition section meets the following relationship:

$60° \leq \theta_2 < 180°$.

Herein, $\theta_1$ represents the included angle between the axis of the evaporation section and the axis of the transition section, and $\theta_2$ represents the included angle between the axis of the condensing section and the axis of the transition section. The evaporation section and the condensing section respectively extend in the directions opposite to each other. The included angle exists between the transition section and each of the evaporation section and the condensing section. In this way, the evaporation section, the transition section, and the condensing section can form a pipeline like a "Z"-shaped pipeline or an "S"-shaped pipeline.

When the heat exchanger provided in this embodiment of this application works, the liquid collection pipe is filled with a phase change working substance. The phase change working substance absorbs heat in the hot environment, and undergoes a transform process from a liquid state to a vapor state. Then, the phase change working substance in a vapor-liquid mixed state absorbs sufficient heat when passing through the evaporation section, and then arrives at the transition section after an accelerated liquid-vapor transform process. Because the transition section is in the junction part between the hot environment and the cold environment, vapor-liquid separation can be relatively fully implemented for the phase change working substance flowing through the transition section, and then a vapor phase change working substance can flow to the vapor collection component along the condensing section. In a process in which the vapor phase change working substance flows to the vapor collection pipe through the condensing section, the vapor phase change working substance in the condensing section and the vapor collection pipe can fully release heat to the cold environment, be transformed to a liquid phase change substance after the heat release process, and then return to the liquid collection pipe. The evaporation section, the transition section, and the condensing section form the foregoing pipeline like the "Z"-shaped pipeline or the "S"-shaped pipeline. In this way, volume optimization of the heat exchanger is also implemented, and assembling space required by the heat exchanger is reduced. However, the vapor-liquid separation process of the phase change working substance can be implemented only by using the evaporation section, the transition section, and the condensing section. Therefore, heat exchange efficiency of the heat exchanger is greatly improved, and structure simplification of the heat exchanger is also implemented, to reduce the manufacturing costs of the heat exchanger, reduce components in the heat exchanger, reduce assembling difficulty and time consumption of the heat exchanger, and improve manufacturing efficiency of the heat exchanger.

Optionally, there are a plurality of exchange pipelines. An upper end of each condensing section in the plurality of exchange pipelines is connected to the vapor collection pipe. A lower end of one condensing section in the plurality of exchange pipelines is connected to a first end of one transition section in the plurality of exchange pipelines. An upper end of one evaporation section in the plurality of exchange pipelines is connected to a second end of the transition section relative to the first end in the plurality of exchange pipelines. A lower end of each evaporation section in the plurality of exchange pipelines is connected to the liquid collection pipe. Each condensing section may be connected to the vapor collection pipe in a radial direction of the vapor collection pipe. Each evaporation section may be connected to the liquid collection pipe in a radial direction of the liquid collection pipe.

Optionally, the exchange pipeline further includes a vapor-liquid separation pipe. The vapor-liquid separation pipe is connected to each transition section. The vapor-liquid separation pipe is connected to the liquid collection component. The vapor-liquid separation pipe is configured to separate a phase change working substance in each transition section into a vapor phase change working substance and a liquid phase change working substance. In this way, when the vapor-liquid mixed phase change working substance passes through the transition section, separation can be better implemented between the liquid phase change working substance and the vapor phase change working substance in the vapor-liquid separation pipe.

Optionally, the vapor-liquid separation pipe includes a main pipe body and a porous separation board. The main pipe body is connected to the transition section and is connected to the liquid collection pipe. The porous separation board is disposed in the main pipe body along an axis of the main pipe body. The porous separation board separates space in the main pipe body into a vapor aggregation cavity and a liquid aggregation cavity. The vapor aggregation cavity is connected to the vapor collection component. The liquid aggregation cavity is connected to the liquid collection component. In this way, when a part of the vapor-liquid mixed phase change working substance enters the main pipe body, the vapor phase change working substance in the vapor-liquid mixed phase change working substance can pass through a hole in the porous separation board, enter the vapor aggregation cavity, and then enter the vapor collection pipe through the vapor aggregation cavity. The liquid phase change working substance remaining in the liquid aggregation cavity may return to the liquid collection pipe through evaporation section.

Optionally, the heat exchanger further includes a rising pipe. One end of the rising pipe is connected to the vapor aggregation cavity. The other end of the rising pipe is connected to the vapor collection pipe. The two ends of the vapor collection pipe are sealed. When there are a plurality of condensing sections, each condensing section is arranged in a length direction of the vapor collection pipe and is connected to the vapor collection pipe.

Optionally, the vapor collection pipe, the vapor-liquid separation pipe, the evaporation section, the condensing section, and the transition section are integrally welded. An integrated welding manner may be tin soldering. Through the tin soldering, the welding costs can be reduced, and organization stability of a welded part between the pipes can also be improved.

Optionally, the heat exchanger further includes a dropping pipe. One end of the dropping pipe is connected to the liquid aggregation cavity. The other end of the dropping pipe is connected to the liquid collection pipe. The two ends of the liquid collection pipe are also sealed. When there are a plurality of evaporation sections, each evaporation section is arranged in a length direction of the liquid collection pipe and is connected to the liquid collection pipe.

Optionally, the liquid collection pipe, the vapor-liquid separation pipe, the evaporation section, the condensing section, and the transition section are integrally welded.

Optionally, the heat exchanger further includes a separation board. The separation board is disposed in the junction part between the hot environment and the cold environment, and is configured to separate the hot environment from the cold environment. The transition section penetrates the separation board. The evaporation section and the liquid collection pipe are located on one side that is of the separation board and that faces the hot environment. The condensing section and the vapor collection pipe are both located on the other side that is of the separation board and that faces the cold environment. In consideration of structure integrity, the separation board may be connected to the vapor-liquid separation pipe. In consideration of the manufacturing costs, the separation board may also cooperate with the transition section.

Optionally, the separation board includes a first separation board and a second separation board. The first separation board and the second separation board are both disposed along an axis of the vapor-liquid separation pipe. An edge of the first separation board and an edge of the second separation board are separately connected to outer walls of two opposite sides of the vapor-liquid separation pipe in a sealing manner.

Optionally, an included angle between an axis of the evaporation section and an axis of the transition section meets the following relationship:

$$60° \leq \theta_1 < 180°.$$

Herein, $\theta_1$ represents the included angle between the axis of the evaporation section and the axis of the transition section. The included angle between the axis of the evaporation section and the axis of the transition section in the heat exchanger may be specifically limited to $120° < \theta_1 < 180°$ or $60° \leq \theta_1 \leq 90°$.

Optionally, an included angle between an axis of the condensing section and the axis of the transition section meets the following relationship:

$$60° \leq \theta_2 < 180°.$$

Herein, $\theta_2$ represents the included angle between the axis of the condensing section and the axis of the transition section. The included angle between the axis of the condensing section and the axis of the transition section in the heat exchanger may be limited to $120° < \theta_1 < 180°$ or $60° \leq \theta_1 \leq 90°$.

Optionally, fins are disposed on an outer wall of the evaporation section. Specifically, fins may be disposed on both the outer wall of the evaporation section and an outer wall of the condensing section.

Optionally, the exchange pipeline further includes a liquid return pipe. One end of the liquid return pipe is connected to the vapor collection component. The other end of the liquid return pipe is connected to the liquid collection component. There may be two liquid return pipes. Ends of the two liquid return pipes are respectively connected to two opposite ends of the vapor collection pipe. The other ends of the two return pipes are respectively connected to two opposite ends of the liquid collection pipe.

Optionally, a heat insulation board is disposed between the liquid return pipe and the adjacent evaporation section.

Optionally, the liquid return pipe is connected to the adjacent evaporation section. A pipe wall thickness of the liquid return pipe meets the following relationship:

$$1 \text{ mm} \leq D \leq 2 \text{ mm}.$$

Herein, D represents the wall thickness of the liquid return pipe.

Optionally, the liquid return pipe is a round pipe or an oblate pipe.

Optionally, two or more liquid return paths are formed in the liquid return pipe.

According to a second aspect, a cabinet is provided, including a cabinet body and the foregoing heat exchanger. A vapor collection component and a condensing section in the heat exchanger are located outside the cabinet body. A liquid collection component and an evaporation section in the heat exchanger are located inside the cabinet body.

The cabinet provided in this embodiment of this application includes the cabinet body and the foregoing heat exchanger. By using a combination of the vapor collection component, the liquid collection component, and an exchange pipeline in the foregoing heat exchanger, heat exchange efficiency of the heat exchanger is greatly improved, and structure simplification and volume optimization of the heat exchanger are also implemented, to reduce the manufacturing costs of the heat exchanger. In this way, heat dissipation performance of a related device in the cabinet is improved, the overall manufacturing costs of the cabinet are reduced, and overall manufacturing efficiency of the cabinet is improved.

According to a third aspect, a communications base station is provided, including the foregoing cabinet.

The communications base station provided in this embodiment of this application includes the foregoing cabinet. By using the foregoing cabinet, heat dissipation performance of a device in the cabinet is improved by using a heat exchanger disposed in the foregoing cabinet. In this way, overall heat dissipation performance of the communications base station is improved, which helps improve overall performance of the communications base station.

REFERENCE NUMERALS IN THE DRAWINGS

| 10: Heat exchanger | 20: Vapor collection pipe | 21: Rising pipe |
|---|---|---|
| 30: Liquid collection pipe | 31: Dropping pipe | 40: Exchange pipeline |
| 41: Condensing section | 42: Evaporation section | 43: Transition section |
| 44: Vapor-liquid separation pipe | 45: Fin | 46: Liquid return pipe |
| 47: Heat insulation board | 50: Separation board | 51: First separation board |
| 52: Second separation board | 100: Cabinet | 441: Main pipe body |
| 442: Porous separation board | 443: Vapor aggregation cavity | 444: Liquid aggregation cavity |
| 461: Liquid return path | | |

DESCRIPTION OF EMBODIMENTS

In the description of this application, it should be understood that directions or position relationships indicated by terms "length", "width", "up", "down", "top", "bottom", and the like are based on directions or position relationships shown in the accompanying drawings, which are used only for describing this application and for description simplicity, but do not indicate or imply that an indicated apparatus or component must have a specific direction or must be constructed and operated in a specific direction. Therefore, this should not be understood as a limitation on this application.

In addition, the terms "first" and "second" are merely intended for a purpose of description, and shall not be understood as an indication or implication of relative importance or implicit indication of the number of indicated technical features. Therefore, a feature limited by "first" or "second" may explicitly or implicitly include one or more features. In the descriptions of this application, "a plurality of" means two or more than two, unless otherwise specifically limited.

In this application, terms "installation", "connect", "connection", "fix", and the like should be understood in a broad sense unless otherwise expressly stipulated and limited. For example, "connection" may be fixed connection, dismountable connection, or integrated connection; may be mechanical connection or electrical connection; or may be direct connection, indirect connection through an intermediate medium, or connection inside two components or a mutual relationship between two components. A person of ordinary skill in the art may interpret specific meanings of the foregoing terms in this application according to specific cases.

Figure 1:
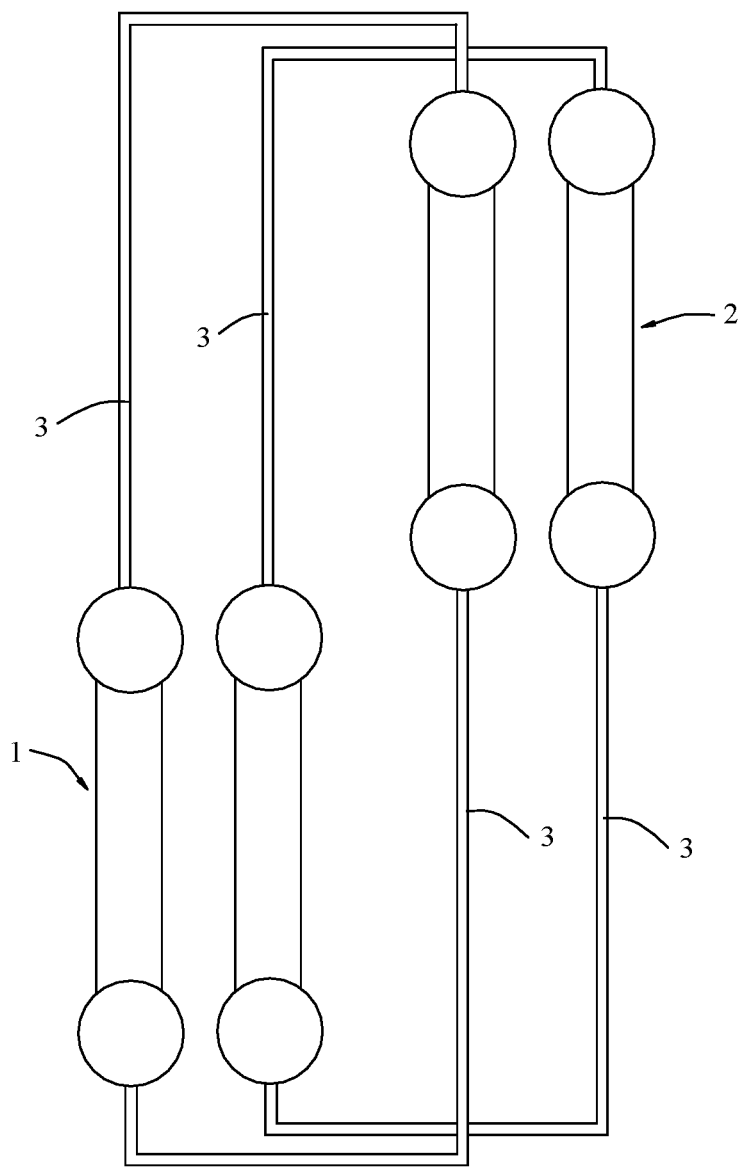
FIG. 1 is a schematic diagram of a structure of an existing heat exchange device.

For ease of understanding, this application first briefly explains a principle of a thermosyphon (TS). As shown in FIG. 1, the thermosyphon has an evaporator 1 and a condenser 2. A phase change working substance in the evaporator 1 absorbs heat from a hot environment, so that a liquid phase change working substance is evaporated to a vapor phase change working substance. The vapor phase change working substance rises to the condenser 2 under a pressure difference function due to heat, and is converted to the liquid phase change working substance after heat release. The liquid phase change working substance returns to the evaporator 1 due to gravity.

In an existing heat exchange device, the evaporator 1 and the condenser 2 need to be separately disposed. Because the evaporator 1 and the condenser 2 are independent components, an additional connection pipeline 3 needs to be disposed to connect the evaporator 1 and the condenser 2. In this case, the heat exchange device has a large volume, the manufacturing costs are high, and manufacturing efficiency is not high.

Therefore, an embodiment of this application provides a heat exchanger 10, a cabinet 100, and a communications base station, so that the manufacturing costs of the heat exchanger 10 can be preferably reduced and manufacturing efficiency of the heat exchanger 10 can be improved.

Figure 2:
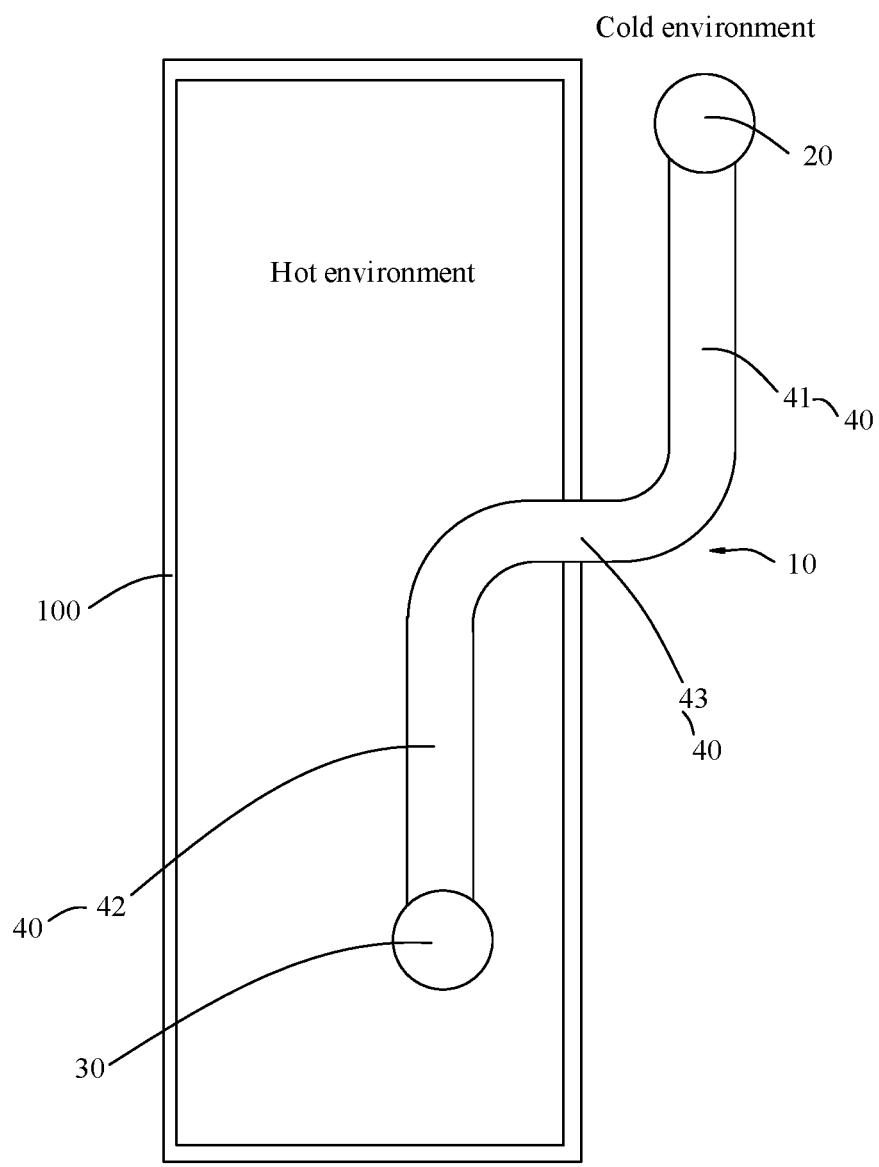
FIG. 2 is a schematic diagram of a structure of a heat exchanger and a cabinet according to an embodiment of this application.
Figure 3:
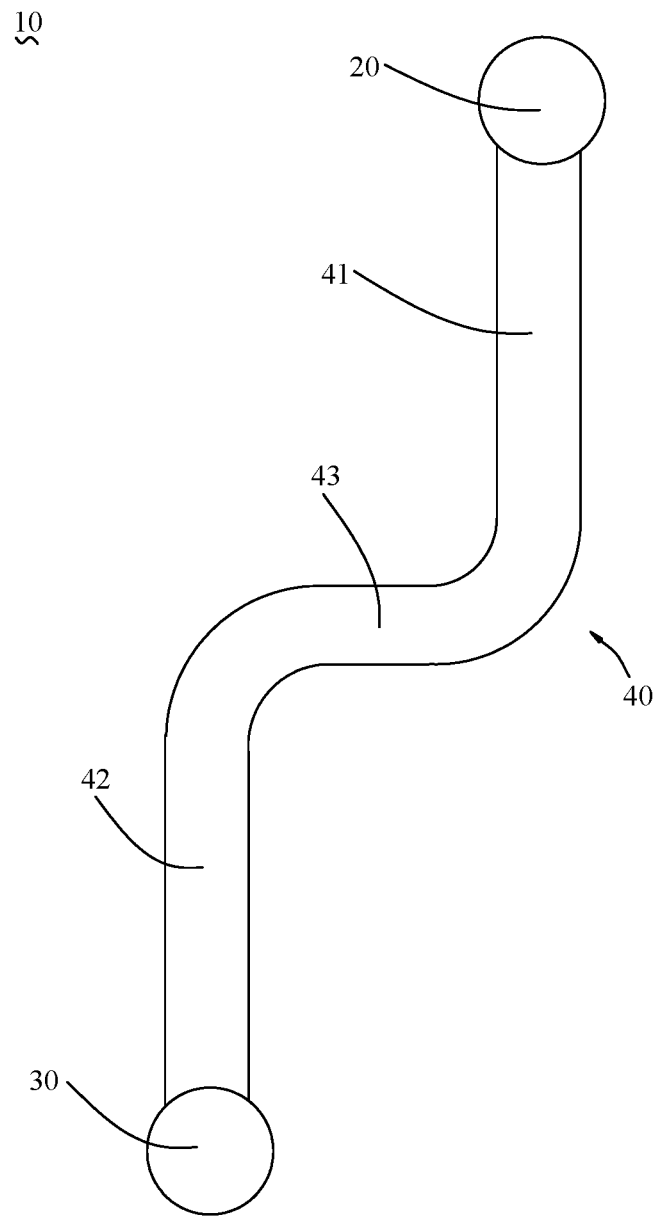
FIG. 3 is a schematic diagram of a structure of a heat exchanger according to an embodiment of this application.
Figure 4:
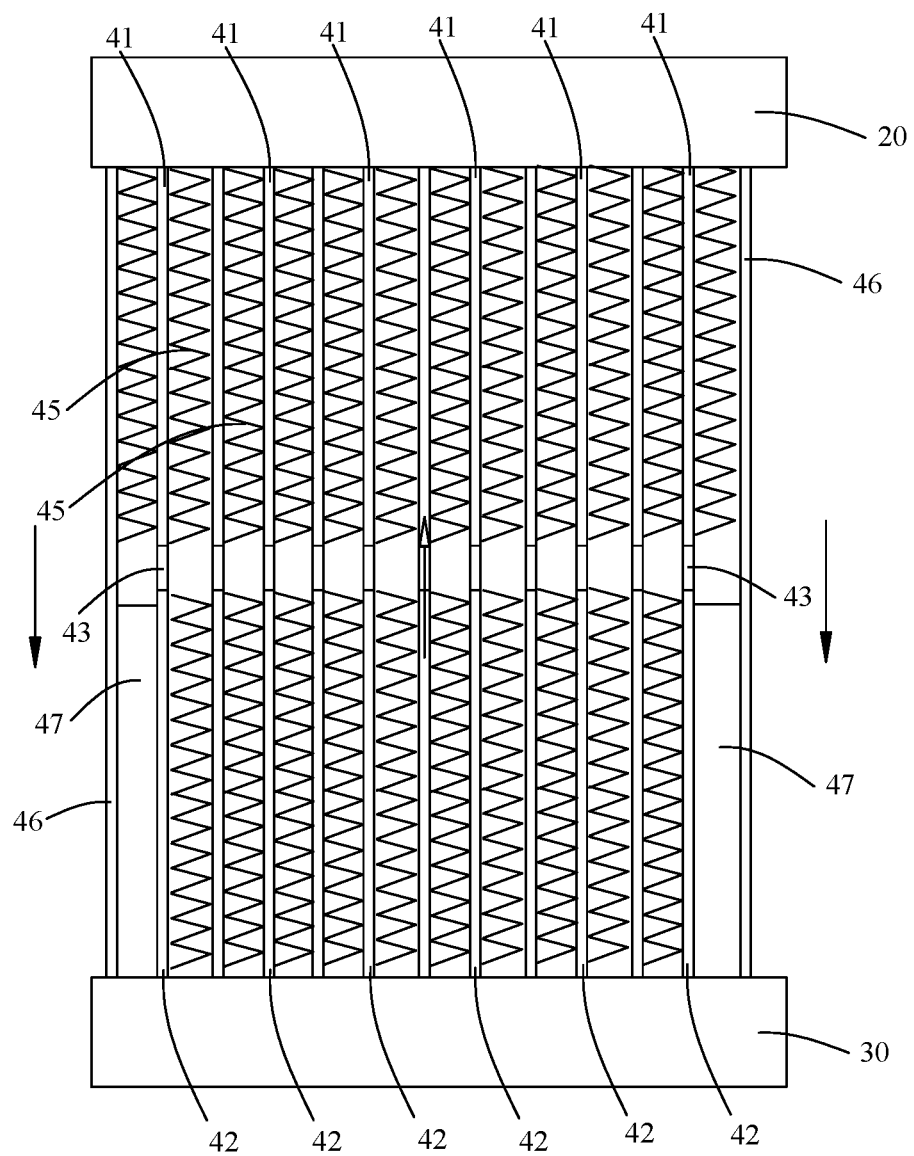
FIG. 4 is a schematic front view of the heat exchanger shown in FIG. 3.

As shown in FIG. 2 to FIG. 4, this embodiment of this application provides the heat exchanger 10, the cabinet 100, and the communications base station. The communications base station indicates an interface device by using which a mobile device accesses the Internet. The cabinet may be an outdoor cabinet that is in the communications base station and that is configured to accommodate a module of a related device. When a device in the cabinet 100 runs, heat is greatly dissipated. Therefore, heat accumulates in the cabinet 100 to form the hot environment. An air environment outside the cabinet 100 is a cold environment relative to the hot environment. In this embodiment, a specific temperature range is not limited for the hot environment and the cold environment.

In this embodiment, the heat exchanger 10 mainly includes the following components: a vapor collection pipe 20, a liquid collection pipe 30, and an exchange pipeline 40. The vapor collection pipe 20 is disposed in the cold environment. The liquid collection pipe 30 is disposed in the hot environment. Specifically, the exchange pipeline 40 includes a condensing section 41, an evaporation section 42, and a transition section 43. An upper end of the condensing section 41 is connected to the vapor collection pipe 20. A lower end of the condensing section 41 is connected to a first end of the transition section 43. An upper end of the evaporation section 42 is connected to a second end of the transition section 43 relative to the first end. A lower end of the evaporation section 42 is connected to the liquid collection pipe 30.

More specifically, the upper end of the condensing section 41 is connected to the vapor collection pipe 20. The lower end of the condensing section 41 is connected to the first end of the transition section 43. The upper end of the evaporation section 42 is connected to the second end of the transition section 43 relative to the first end. The lower end of the evaporation section 42 is connected to the liquid collection pipe 30.

Figure 10:
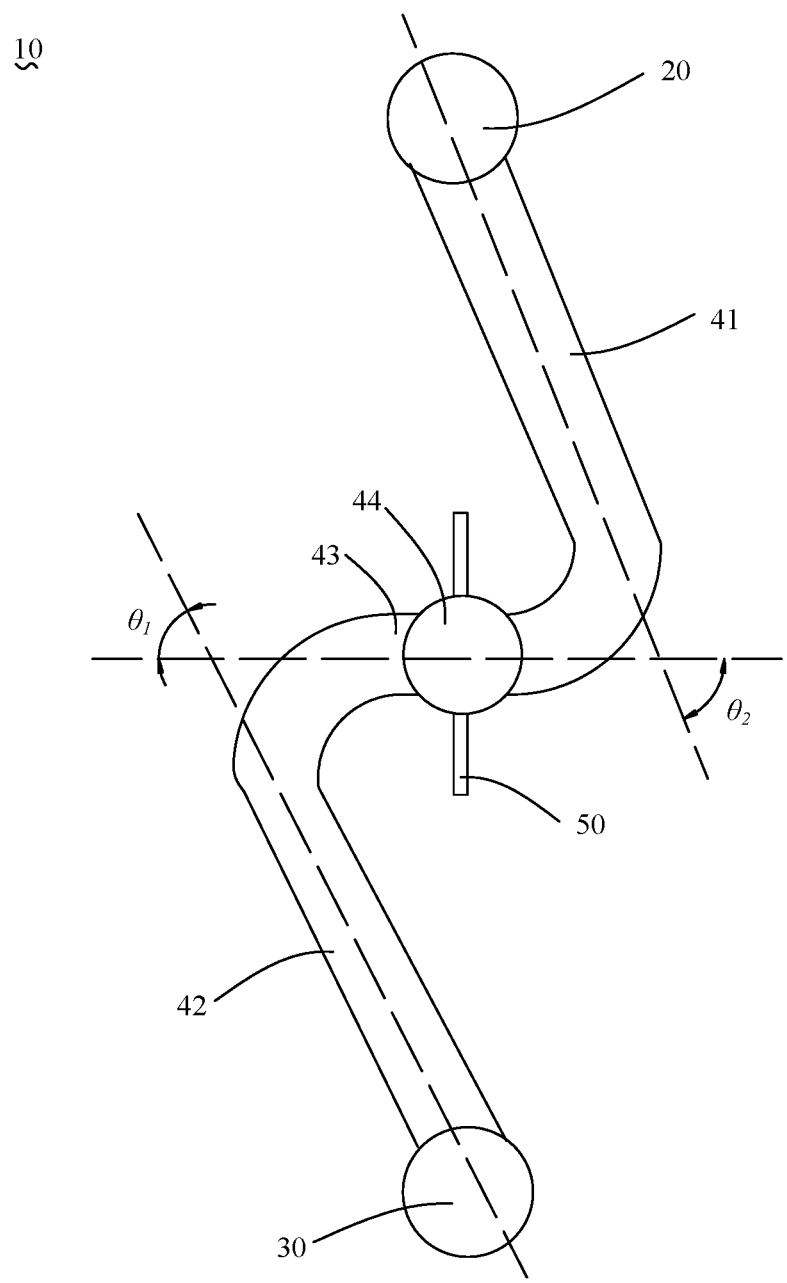
FIG. 10 is a schematic diagram of a structure of a heat exchanger according to an embodiment of this application.

With reference to FIG. 10, the evaporation section 42 and the condensing section 41 respectively extend in directions opposite to each other. An included angle between an axis of the evaporation section 42 and an axis of the transition section 43 meets the following relationship:

$$60° \leq \theta_1 < 180°.$$

An included angle between an axis of the condensing section 41 and the axis of the transition section 43 meets the following relationship:

$$60° \leq \theta_2 < 180°.$$

Herein, $\theta_1$ represents the included angle between the axis of the evaporation section 42 and the axis of the transition section 43, and $\theta_2$ represents the included angle between the axis of the condensing section 41 and the axis of the transition section 43. The evaporation section 42 and the condensing section 41 respectively extend in the directions opposite to each other. The included angle exists between the transition section 43 and each of the evaporation section 42 and the condensing section 41. In this way, the evaporation section 42, the transition section 43, and the condensing section 41 can form a pipeline like a "Z"-shaped pipeline or an "S"-shaped pipeline.

When the heat exchanger 10 is applied to the cabinet 100 for heat dissipation, the liquid collection pipe 30 and the evaporation section 42 in the heat exchanger 10 are located in the hot environment in the cabinet body in the cabinet 100, so that a phase change working substance flowing through the liquid collection pipe 30 and the evaporation section 42 rapidly absorbs heat. The vapor collection pipe 20 and the condensing section 41 in the heat exchanger 10 are located in the cold environment outside the cabinet body in the cabinet 100, so that the phase change working substance flowing through the vapor collection pipe 20 and the condensing section 41 rapidly release heat. The transition section 43 is located at a junction part between the hot environment and the cold environment.

With reference to FIG. 2, the heat exchanger 10 provided in this embodiment of this application is further described in the following. When the heat exchanger 10 works, the liquid collection pipe 30 is filled with the phase change working substance. The phase change working substance absorbs heat in the hot environment, and undergoes a transform process from a liquid state to a vapor state. Then, a phase change working substance in a vapor-liquid mixed state absorbs sufficient heat when passing through the evaporation section 42, and then arrives at the transition section 43 after an accelerated liquid-vapor transform process. Because the transition section 43 is in the junction part between the hot environment and the cold environment, vapor-liquid separation can be relatively fully implemented for the phase change working substance flowing through the transition section 43, and then the vapor phase change working substance can flow to the vapor collection pipe 20 along the condensing section 41. In a process in which the vapor phase change working substance flows to the vapor collection pipe 20 through the condensing section 41, the vapor phase change working substance in the condensing section 41 and the vapor collection pipe 20 can fully release heat to the cold environment, be transformed to the liquid phase change working substance after the heat release process, and then return to the liquid collection pipe 30.

The evaporation section 42, the transition section 43, and the condensing section 41 form the foregoing pipeline like the "Z"-shaped pipeline or the "S"-shaped pipeline. In this way, volume optimization of the heat exchanger 10 is also implemented, and assembling space required by the heat exchanger 10 is reduced. However, the vapor-liquid separation process of the phase change working substance can be implemented only by using the evaporation section, the transition section, and the condensing section. Therefore, heat exchange efficiency of the heat exchanger 10 is greatly improved, and structure simplification of the heat exchanger 10 is also implemented, to reduce the manufacturing costs of the heat exchanger 10, reduce components in the heat exchanger 10, reduce assembling difficulty and time consumption of the heat exchanger 10, and improve manufacturing efficiency of the heat exchanger 10.

The cabinet 100 provided in this embodiment of this application includes the cabinet body and the foregoing heat exchanger 10. By using a combination of the vapor collection pipe 20, the liquid collection pipe 30, and the exchange pipeline 40 in the foregoing heat exchanger 10, heat exchange efficiency of the heat exchanger 10 is greatly improved, and structure simplification and volume optimization of the heat exchanger 10 are also implemented, to reduce the manufacturing costs of the heat exchanger 10. In this way, heat dissipation performance of a related device in the cabinet 100 is improved, the overall manufacturing costs of the cabinet 100 are reduced, and overall manufacturing efficiency of the cabinet 100 is improved.

The communications base station provided in this embodiment of this application includes the foregoing cabinet 100. By using the foregoing cabinet 100, heat dissipation performance of a device in the cabinet 100 is improved by using the heat exchanger 10 disposed in the foregoing cabinet 100. In this way, overall heat dissipation performance of the communications base station is improved, which helps improve overall performance of the communications base station.

In another embodiment of this application, the evaporation section 42, the transition section 43, and the condensing section 41 are formed through bending a pipe. Specifically, the evaporation section 42, the transition section 43, and the condensing section 41 are formed through bending the pipe. In this way, a manufacturing process of the evaporation section 42, the transition section 43, and the condensing section 41 is simplified, so that the evaporation section 42, the transition section 43, and the condensing section 41 can be integrally manufactured, to reduce the manufacturing costs of the evaporation section 42, the transition section 43, and the condensing section 41. In this way, manufacturing efficiency of the evaporation section 42, the transition section 43, and the condensing section 41 are improved, and an overall manufacturing process of the heat exchanger 10 is simplified.

In another aspect, the evaporation section, the transition section, and the condensing section are formed through bending a pipe, to improve overall strength of the evaporation section, the transition section, and the condensing section and sealing performance of a connection part between the evaporation section, the transition section, and the condensing section. This greatly reduces a probability that the phase change working substance leaks from the connection part between the evaporation section, the transition section, and the condensing section.

In another embodiment of this application, as shown in FIG. 4, there are a plurality of exchange pipelines 40. An upper end of each condensing section 41 in the plurality of exchange pipelines 40 is connected to the vapor collection pipe 20. A lower end of one condensing section 41 in the plurality of exchange pipelines 40 is connected to a first end of one transition section 43 in the plurality of exchange pipelines 40. An upper end of one evaporation pipe 42 in the plurality of exchange pipelines 40 is connected to a second end of the transition section 43 relative to the first end in the plurality of exchange pipelines 40. A lower end of each evaporation section 42 in the plurality of exchange pipelines 40 is connected to the liquid collection pipe 30.

Specifically, to improve heat exchange efficiency of the heat exchanger 10, there may be a plurality of exchange pipelines 40. In this way, each condensing section 41 may be connected to the vapor collection pipe 20 in a radial direction of the vapor collection pipe 20. Each evaporation section 42 may be connected to the liquid collection pipe 30 in a radial direction of the liquid collection pipe 30. Therefore, assembling space of the heat exchanger 10 is fully used, to dispose the condensing section 41 and the evaporation section 42 as many as possible, thereby implementing higher heat exchange efficiency of the heat exchanger 10.

Optionally, the evaporation sections 42 are disposed at intervals, so that each evaporation section 42 can fully contact the hot environment. In this way, the phase change working substance flowing in each evaporation section 42 can fully absorb heat from the hot environment. Likewise, the condensing sections 41 may also be disposed at intervals, so that each condensing section 41 can fully contact the cold environment. In this way, the phase change working substance flowing in each condensing section 41 can fully release heat to the cold environment.

Figure 5:
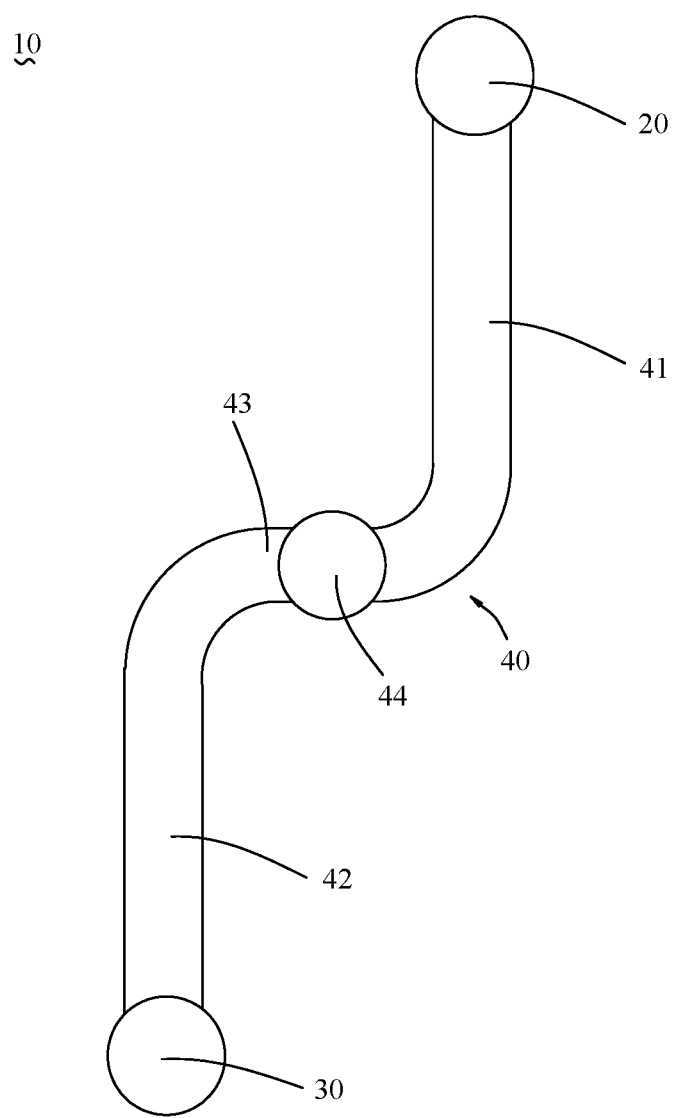
FIG. 5 is a schematic diagram of a structure of a heat exchanger according to an embodiment of this application.
Figure 6:
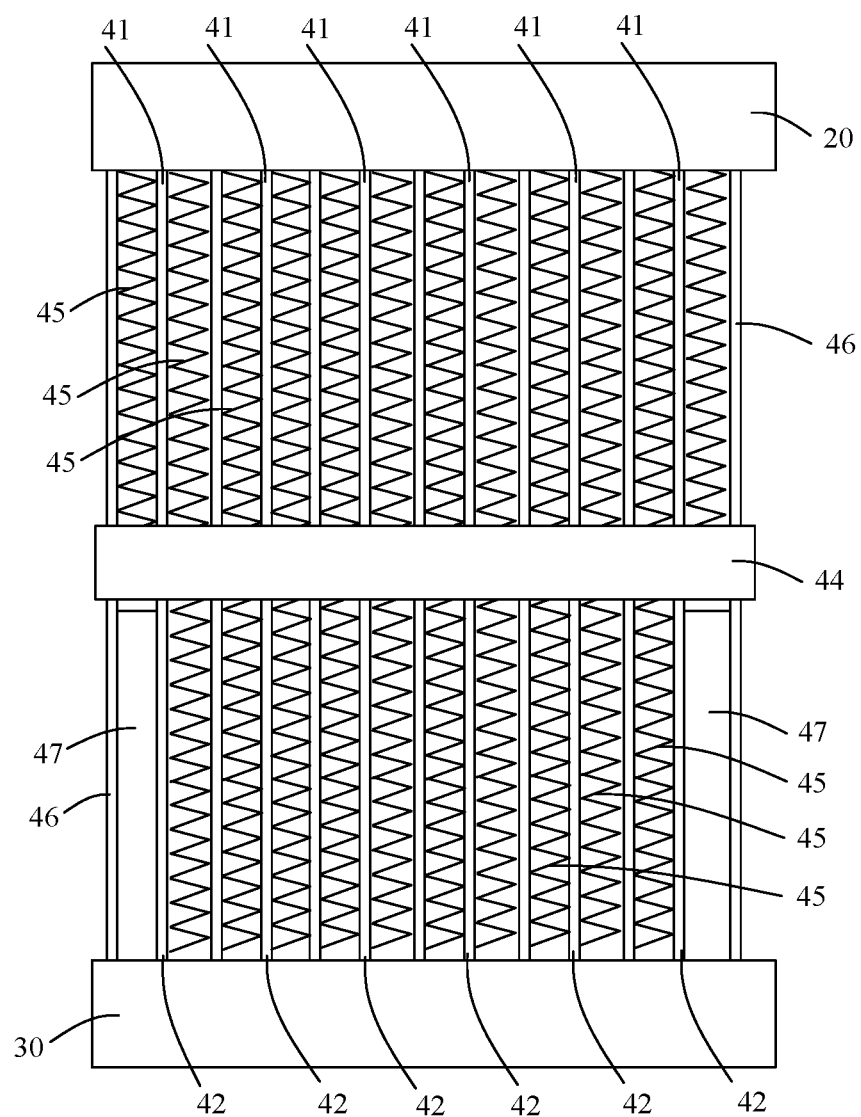
FIG. 6 is a schematic front view of the heat exchanger shown in FIG. 5.

In another embodiment of this application, as shown in FIG. 5 and FIG. 6, the exchange pipeline 40 further includes a vapor-liquid separation pipe 44. The vapor-liquid separation pipe 44 is connected to each transition section 43. The vapor-liquid separation pipe 41 is configured to separate the phase change working substance in each transition section 43 into the vapor phase change working substance and the liquid phase change working substance. Specifically, the vapor-liquid separation pipe 44 is disposed. In this way, when the vapor-liquid mixed phase change working substance passes through the transition section 43, separation can be better implemented for the liquid phase change working substance and the vapor phase change working substance in the vapor-liquid separation pipe 44, to better improve heat exchange efficiency of the heat exchanger 10.

Figure 7:
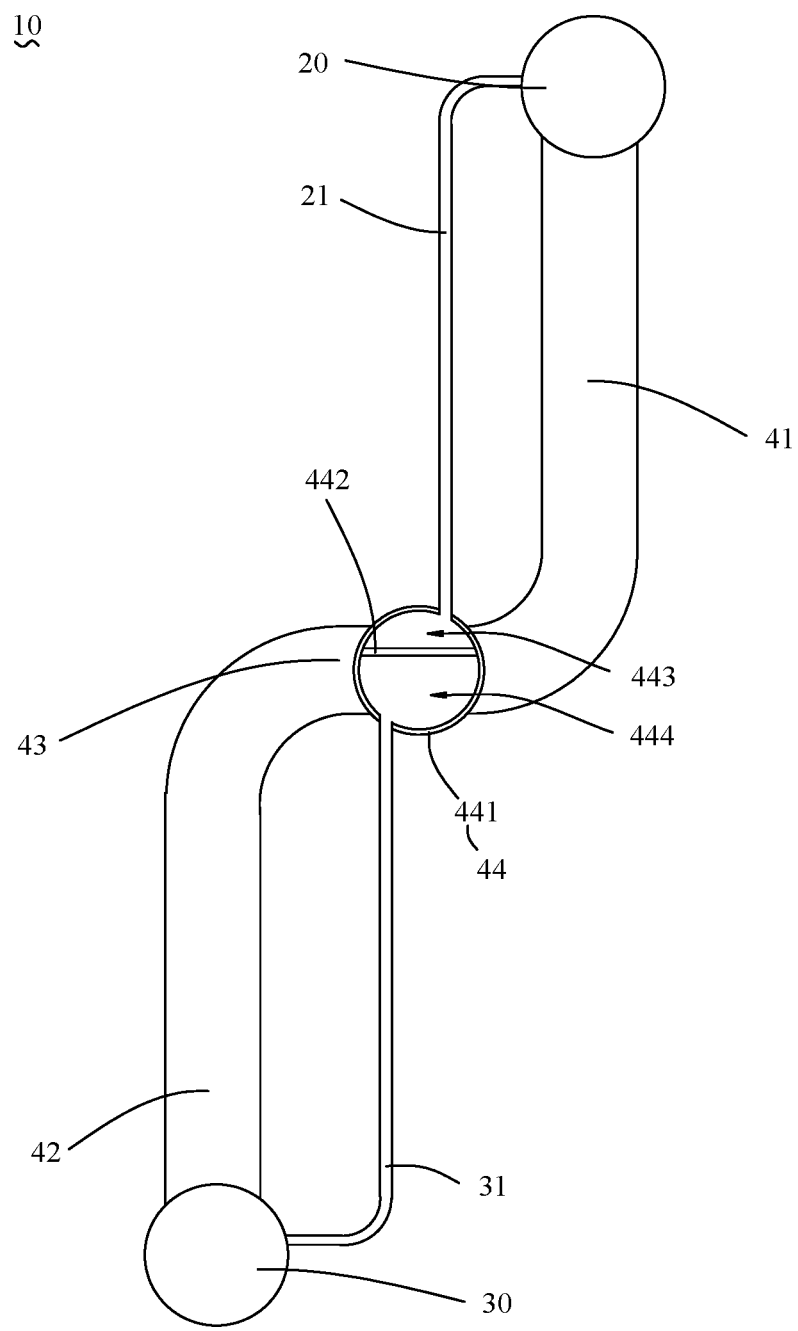
FIG. 7 is a schematic diagram of a structure of a heat exchanger according to an embodiment of this application.

In another embodiment of this application, as shown in FIG. 7, the vapor-liquid separation pipe 44 includes a main pipe body 441 and a porous separation board 442. The main pipe body 441 is connected to the transition section 43 and is connected to the liquid collection pipe 30. The porous separation board 442 is disposed in the main pipe body 441 along an axis of the main pipe body 441. The porous separation board 442 separates space in the main pipe body 441 into a vapor aggregation cavity 443 and a liquid aggregation cavity 444. The vapor aggregation cavity 443 is connected to the vapor collection pipe 20. The liquid aggregation cavity 444 is connected to the liquid collection pipe 30.

Specifically, the vapor-liquid separation pipe 44 includes the main pipe body 441 and the porous separation board 442. In this way, when a part of the vapor-liquid mixed phase change working substance enters the main pipe body 441, the vapor phase change working substance in the vapor-liquid mixed phase change working substance can pass through a hole in the porous separation board 442, enter the vapor aggregation cavity 443, and then enter the vapor collection pipe 20 through the vapor aggregation cavity 443. The liquid phase change working substance remaining in the liquid aggregation cavity 444 may return to the liquid collection pipe 30 through evaporation section 42. In this way, flowing efficiency of the vapor phase change working substance and the liquid phase change working substance is improved. In addition, vapor-liquid separation efficiency of the phase change working substance is improved, to improve overall heat exchange efficiency of the heat exchanger 10.

In another embodiment of this application, as shown in FIG. 7, the heat exchanger 10 further includes a rising pipe 21 of the vapor collection pipe 20. The vapor collection pipe 20 is connected to the condensing section 41. One end of the rising pipe 21 is connected to the vapor aggregation cavity 443. The other end of the rising pipe 21 is connected to the vapor collection pipe 20.

Specifically, two ends of the vapor collection pipe 20 are sealed. When there are a plurality of condensing sections 41, each condensing section 41 is arranged in a length direction of the vapor collection pipe 20 and is connected to the vapor collection pipe 20. In this way, assembling space in the length direction of the vapor collection pipe 20 can be fully used to dispose a sufficient quantity of condensing sections 41, to improve heat exchange efficiency of the heat exchanger 10.

Because of the existence of the rising pipe 21, the vapor phase change working substance in the vapor aggregation cavity 443 can enter the vapor collection pipe 20 through the rising pipe 21. The rising pipe 21 may be exposed in the cold environment. In this way, when entering the rising pipe 21, the vapor phase change working substance can release heat to the cold environment, to improve overall heat exchange efficiency of the heat exchanger 10.

In another embodiment of this application, the vapor collection pipe 20, the vapor-liquid separation pipe 44, the evaporation section 42, the condensing section 41, and the transition section 43 are integrally welded. The vapor collection pipe 20, the vapor-liquid separation pipe 44, the evaporation section 42, the condensing section 41, and the transition section 43 are integrally welded, to improve processing manufacturing efficiency of the heat exchanger 10.

For example, the integrated welding manner of the vapor collection pipe 20, the vapor-liquid separation pipe 44, the evaporation section 42, the condensing section 41, and the transition section 43 may be vapor protection welding or aluminum soldering. The vapor protection welding or the aluminum soldering can be used to reduce the welding costs and improve organization stability of a welded part between the foregoing pipes, so that the integrally welded heat exchanger 10 has relatively good overall strength.

In another embodiment of this application, the evaporation section 42, the condensing section 41, and the transition section 43 may be integrally formed. The integrated forming manner may be casting forming or extrusion forming. The evaporation section 42, the condensing section 41, and the transition section 43 may first cast or extruded to form an entire pipeline. Then, the entire pipeline is bent to form the evaporation section 42, the condensing section 41, and the transition section 43. In addition, the evaporation section 42, the condensing section 41, and the transition section 43 may be first bent, and then be integrally welded with the vapor collection pipe 20 and the vapor-liquid separation pipe 44. Alternatively, the entire pipeline formed through casting or extrusion is integrally welded with the vapor collection pipe 20 and the vapor-liquid separation pipe 44, and then the entire pipeline is bent to form the evaporation section 42, the condensing section 41, and the transition section 43.

In another embodiment of this application, as shown in FIG. 7, the heat exchanger 10 further includes a dropping pipe 31. One end of the dropping pipe 31 is connected to the liquid aggregation cavity 444. The other end of the dropping pipe 31 is connected to the liquid collection pipe 30.

Specifically, like the manner of forming the vapor collection pipe 20, two ends of the liquid collection pipe 30 are also sealed. When there are a plurality of evaporation sections 42, each evaporation section 42 is arranged in a length direction of the liquid collection pipe 30 and is connected to the liquid collection pipe 30. In this way, assembling space in the length direction of the vapor collection pipe 20 can be fully used, to improve heat exchange efficiency of the heat exchanger 10.

In another embodiment of this application, the liquid collection pipe 30, the vapor-liquid separation pipe 44, the evaporation section 42, the condensing section 41, and the transition section 43 are integrally welded. Specifically, the liquid collection pipe 30, the vapor-liquid separation pipe 44, the evaporation section 42, the condensing section 41, and the transition section 43 are integrally welded, to improve processing manufacturing efficiency of the heat exchanger 10.

Optionally, the vapor collection pipe 20, the liquid collection pipe 30, the vapor-liquid separation pipe 44, the evaporation section 42, the condensing section 41, the transition section 43, the rising pipe 21, and the dropping pipe 31 may be all integrally welded, to better reduce the manufacturing costs of the heat exchanger 10 and improve manufacturing efficiency of the heat exchanger 10.

Figure 8:
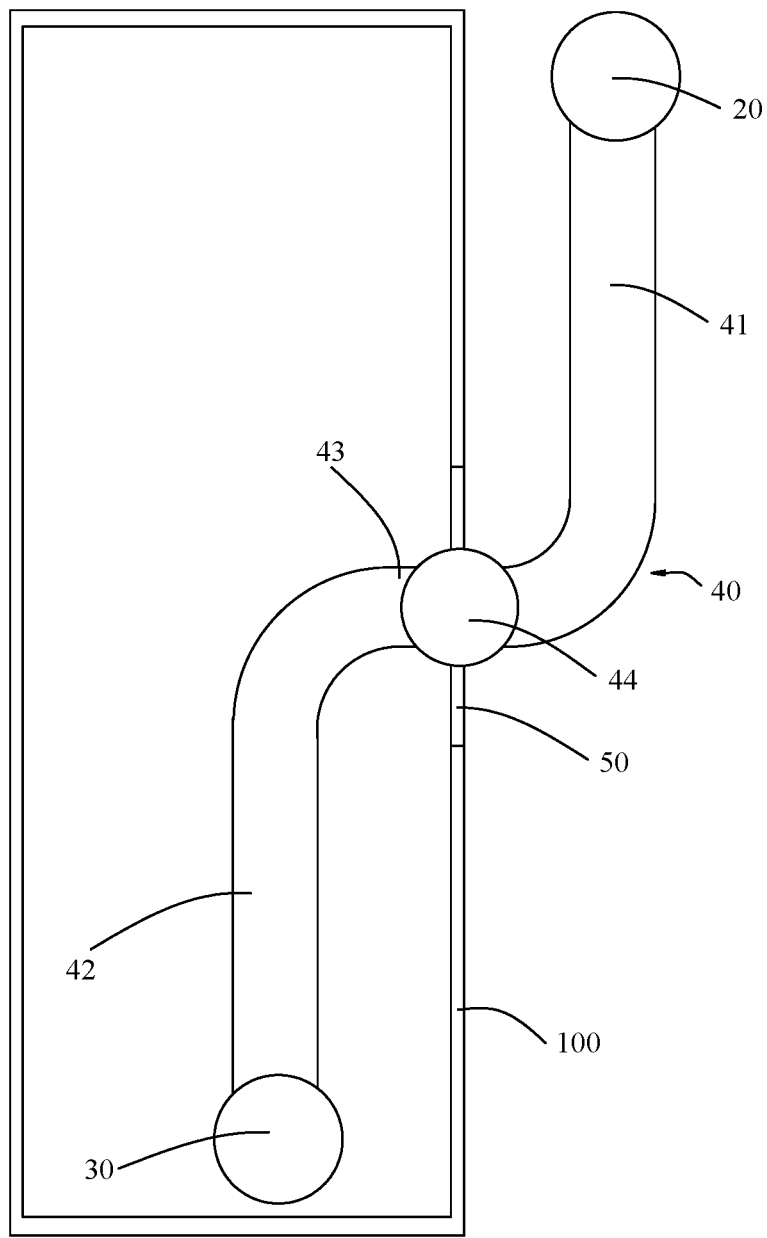
FIG. 8 is a schematic diagram of a structure of a heat exchanger according to an embodiment of this application.
Figure 9:
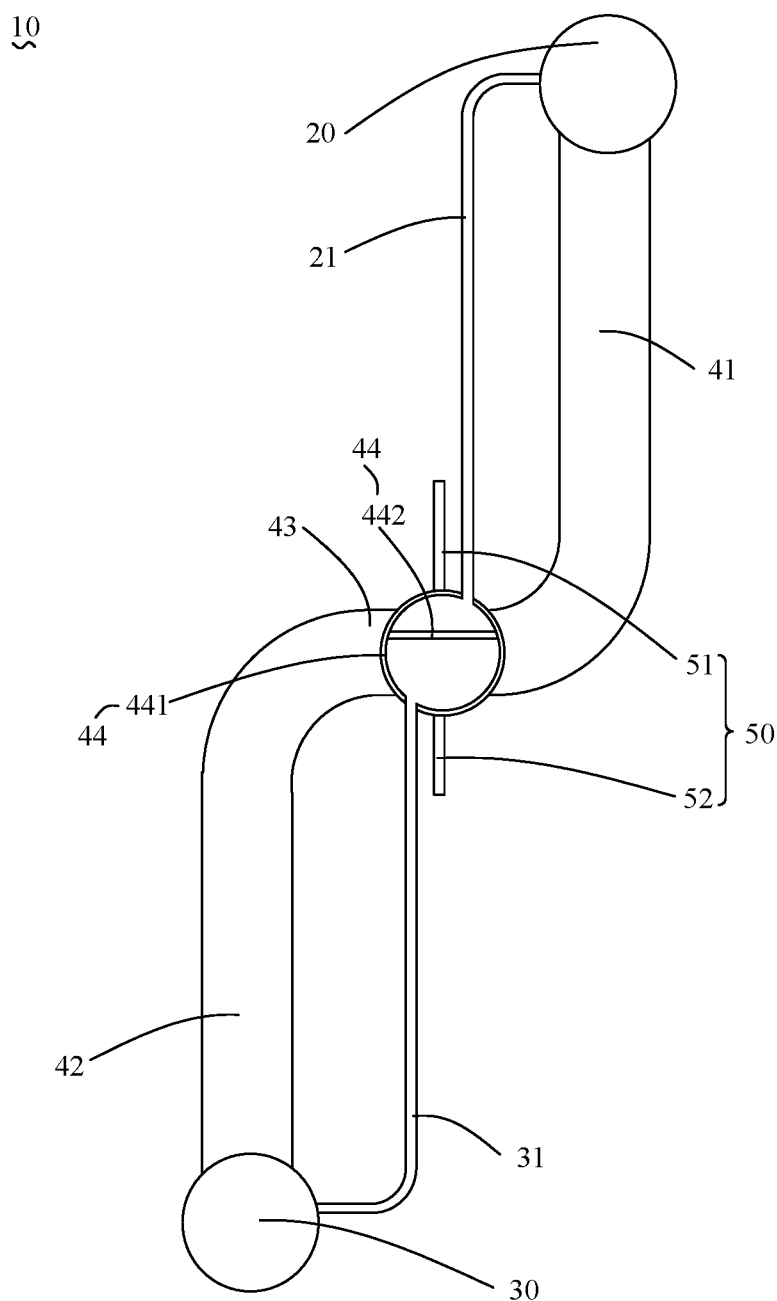
FIG. 9 is a schematic diagram of a structure of a heat exchanger according to an embodiment of this application.

In another embodiment of this application, as shown in FIG. 8 and FIG. 9, the heat exchanger 10 further includes a separation board 50. The separation board 50 is disposed in the junction part between the hot environment and the cold environment, and is configured to separate the hot environment from the cold environment. The transition section 43 penetrates the separation board 50. The evaporation section 42 and the liquid collection pipe 30 are located on one side of the separation board 50 (that is, the side that is of the separation board 50 and that faces the hot environment). The condensing section 41 and the vapor collection pipe 20 are both located on the other side of the separation board 50 (that is, the side that is of the separation board 50 and that faces the cold environment).

Specifically, the separation board 50 can separate the hot environment from the cold environment, to avoid mutual impacts between the hot environment and the cold environment. In this way, a stable hot environment can be established for the evaporation section 42 and the liquid collection pipe 30, so that the phase change working substance flowing in the evaporation section 42 and the liquid collection pipe 30 has relatively high efficiency of absorbing heat from the hot environment. In addition, a stable cold environment is also established for the condensing section 41 and the vapor collection pipe 20, so that the phase change working substance flowing in the condensing section 41 and the vapor collection pipe 20 has relatively high efficiency of releasing heat to the cold environment.

For example, in consideration of structure integrity, the separation board 50 may be connected to the vapor-liquid separation pipe 44. In consideration of the manufacturing costs, the separation board 50 may also cooperate with the transition section 43. When the heat exchanger 10 is applied to the cabinet 100, the separation board 50 may be disposed at an opening that is provided on an outer wall of the cabinet 100 for protrusion of the transition section 43, to seal an internal environment of the cabinet 100. In this way, heat in the cabinet 100 does not escape from the opening, and consequently, heat release of the phase change working substance in the condensing section 41 is affected.

In another embodiment of this application, as shown in FIG. 9, the separation board 50 includes a first separation board 51 and a second separation board 52. The first separation board 51 and the second separation board 52 are both disposed along an axis of the vapor-liquid separation pipe 44. An edge of the first separation board 51 and an edge of the second separation board 52 are separately connected to outer walls of two opposite sides of the vapor-liquid separation pipe 44 in a sealing manner.

Specifically, when the separation board 50 is connected to the vapor-liquid separation pipe 44, the separation board 50 may include the first separation board 51 and the second separation board 52. The edge of the first separation board 51 and the edge of the second separation board 52 are separately connected to the outer walls of the two opposite sides of the vapor-liquid separation pipe 44 in a sealing manner. In this way, cooperation between the separation board 50 and the vapor-liquid separation pipe 44 is implemented. In addition, sealing is also implemented at a connection part between the separation board 50 and the vapor-liquid separation pipe 44, to prevent hot air in the cabinet 100 from escaping to the outside from the connection part between the separation board 50 and the vapor-liquid separation pipe 44.

In another embodiment of this application, when space in a width direction in the cabinet body of the cabinet 100 is sufficient, the included angle between the axis of the evaporation section 42 and the axis of the transition section 43 in the heat exchanger 10 may be limited to $120°<\theta_{1<180}°$. In this way, when the space in the width direction in the cabinet body is fully used, the evaporation section 42 is long enough to enable the phase change working substance in the evaporation section 42 to fully absorb heat.

When the width space in the cabinet body of the cabinet 100 is limited and space in a height direction is insufficient, the included angle between the axis of the evaporation section 42 and the axis of the transition section 43 may be limited to $60°\leq\theta_1\leq90°$. In this way, when the space in the width direction and the space in the height direction in the cabinet body are fully used, the length of the evaporation section 42 can also long enough.

In another embodiment of this application, when space outside the cabinet 100 in the cold environment is sufficient, the included angle between the axis of the condensing section 41 and the axis of the transition section 43 in the heat exchanger 10 may be limited to $120°<\theta_1<180°$. In this way, the space in the cold environment can be fully used, and the condensing section 41 can be long enough to enable the phase change working substance in the condensing section 41 to fully release heat.

When the space in the cold environment is insufficient, the included angle between the axis of the evaporation section 42 and the axis of the transition section 43 may be limited to $60°\leq\theta_1\leq90°$. In this way, the space in the cold environment can be fully used, and the length of the condensing section 41 can also be long enough.

Figure 11:
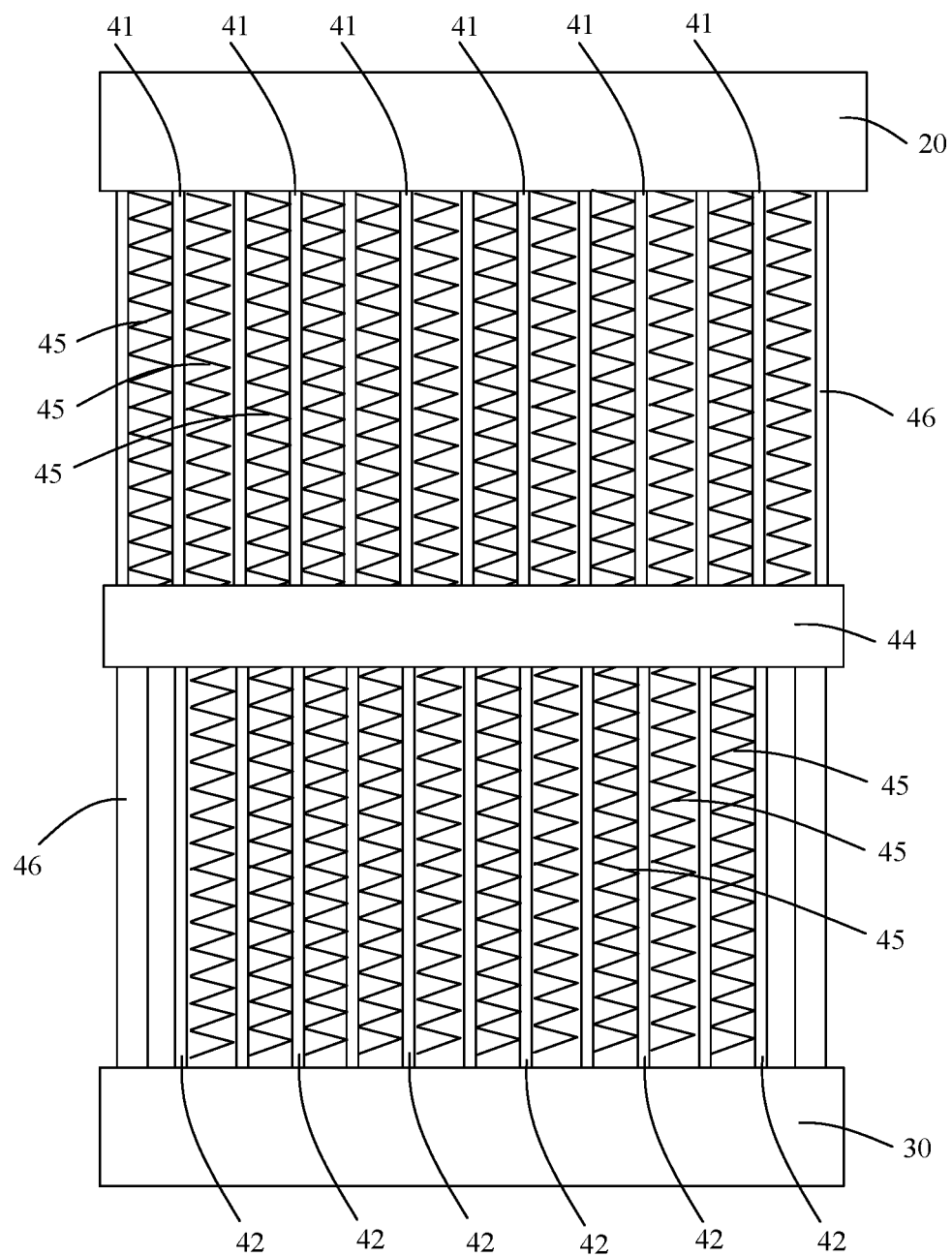
FIG. 11 is a schematic diagram of a structure of a heat exchanger according to an embodiment of this application.
Figure 12:
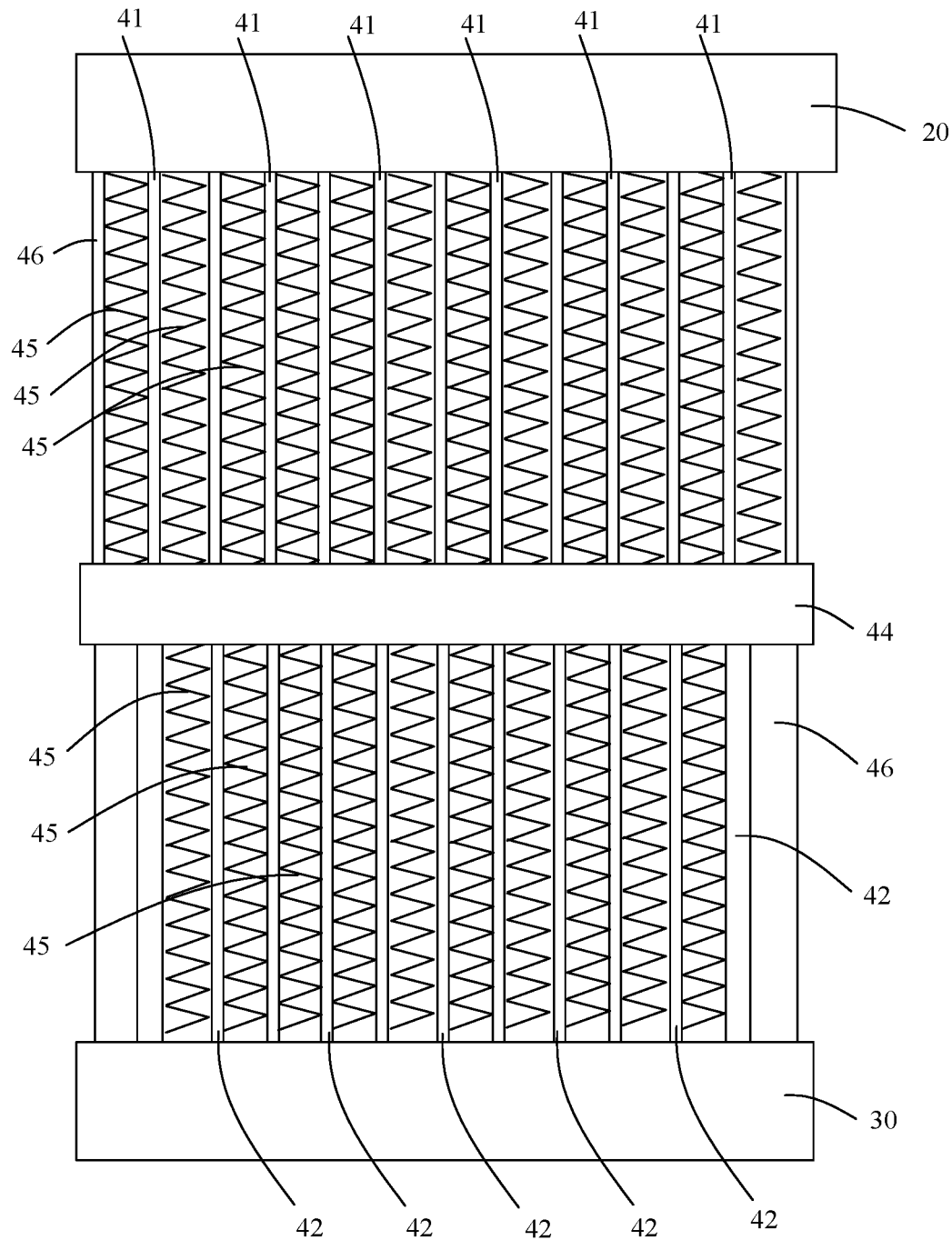
FIG. 12 is a schematic diagram of a structure of a heat exchanger according to an embodiment of this application.

In another embodiment of this application, as shown in FIG. 11 and FIG. 12, fins 45 are disposed on an outer wall of the evaporation section 42. Specifically, the fins 45 are disposed on the outer wall of the evaporation section 42, so that a contact area between the evaporation section 42 and the hot environment can be increased by using the fins 45, to accelerate a heat absorption process of the phase change working substance in the evaporator. In this way, the phase change working substance can fully absorb heat.

In another embodiment of this application, as shown in the figures, fins 45 are disposed on an outer wall of the condensing section 41. Specifically, the fins 45 are disposed on the outer wall of the condensing section 41, so that a contact area between the condensing section 41 and the cold environment can be increased by using the fins 45, to accelerate a heat release process of the phase change working substance in the condenser. In this way, the phase change working substance can fully release heat.

In another embodiment of this application, as shown in FIG. 11 and FIG. 12, fins 45 are disposed on both an outer wall of the evaporation section 42 and an outer wall of the condensing section 41, to fully implement heat absorption and heat release of the phase change working substance, thereby better improving heat exchange efficiency of the heat exchanger 10.

For example, a plurality of fins 45 are sequentially disposed in a length direction of the outer wall of the evaporation section 42 and the outer wall of the condensing section 41. The plurality of fins 45 may be arranged in parallel or in a sawtoothed manner, to make full use of assembling space on the outer wall of the evaporation section 42 and the outer wall of the condensing section 41 and dispose the fins 45 as many as possible.

The plurality of fins 45 corresponding to the evaporation section 42 may further be connected end to end and combined into an entity, so that the plurality of fins 45 and the evaporation section 42 are integrally welded or the plurality of fins 45 are assembled on the evaporation section 42. In this way, assembling efficiency of the fins 45 can be improved, and an assembling process of the fins 45 can be simplified.

In another embodiment of this application, as shown in FIG. 6, FIG. 11, and FIG. 12, the exchange pipeline 40 further includes a liquid return pipe 46. One end of the liquid return pipe 46 is connected to the vapor collection pipe 20. The other end of the liquid return pipe 46 is connected to the liquid collection pipe 30. Specifically, the liquid return pipe 46 is disposed. In this way, a specific path is established for a process in which the liquid phase change working substance converted from the vapor phase change working substance after heat release returns from the vapor collection pipe 20 to the liquid collection pipe 30. Therefore, a cycle speed of the phase change working substance in the heat exchanger 10 can be improved, and heat exchange efficiency of the heat exchanger 10 can be further improved.

For example, there may be two liquid return pipes 46. Ends of the two liquid return pipes 46 are respectively connected to two opposite ends of the vapor collection pipe 20. The other ends of the two liquid return pipes 46 are respectively connected to two opposite ends of the liquid collection pipe 30. In this way, a cycle process of the phase change working substance in the heat exchanger 10 is as follows: The phase change working substance absorbs heat in the hot environment, passes through the vapor-liquid separation pipe 44 along the evaporation section 42 and the transition section 43 from the vapor collection pipe 20, becomes the vapor phase change working substance, and then reaches the vapor collection pipe 20 along the condensing section 41 and/or the rising pipe 22. In this process, the vapor phase change working substance releases heat and then is converted to the liquid phase change working substance; and then, a part of or all of the liquid phase change working substance returns to the liquid collection pipe 30 through the liquid return pipe 46, to implement absorption/release cycle of the phase change working substance. (As shown in FIG. 4, a hollow arrow represents a flowing direction of heat absorption flow of a phase change working substance, and a solid arrow represents a process in which the liquid phase change working substance obtained after heat release returns to the liquid collection pipe 30 through the liquid return pipe 46.)

In another embodiment of this application, as shown in FIG. 6, a heat insulation part is disposed on an outer periphery of the liquid return pipe 46. In this way, the heat insulation part can isolate the liquid return pipe 46 from the surrounding hot environment, so that heat transferred from the hot environment to the liquid return pipe 46 can be greatly reduced. In this way, the liquid return pipe 46 can be in an environment of a relatively low temperature, so that the phase change working substance in the liquid return pipe 46 stays in the liquid state and returns to the liquid collection pipe 30.

In another embodiment of this application, as shown in FIG. 6, the heat insulation part may be specifically a heat insulation board 47. The heat insulation board 47 is disposed between the liquid return pipe 46 and the adjacent evaporation section 42. Specifically, the heat insulation board 47 is disposed between the liquid return pipe 46 and the adjacent evaporation section 42. In this way, the heat insulation board 47 can prevent the evaporation section 42 from radiating heat to the liquid return pipe 46, so that an environment with a relatively low temperature is formed around a pipe segment of the liquid return pipe 46 in the hot environment. Therefore, most of the phase change working substance in the liquid return pipe 46 returns to the liquid collection pipe 30 in the liquid state, to improve the vapor-liquid cycle efficiency of the phase change working substance in the heat exchanger 10.

Optionally, when the heat insulation board 47 is disposed between the liquid return pipe 46 and the adjacent evaporation section 42, the fins 45 are no longer distributed between the liquid return pipe 46 and the adjacent evaporation section 42. In this way, sufficient assembling space can be reserved for the heat insulation board 47, and heat radiated from the evaporation section 42 to the liquid return pipe 46 can also be reduced.

Figure 13:
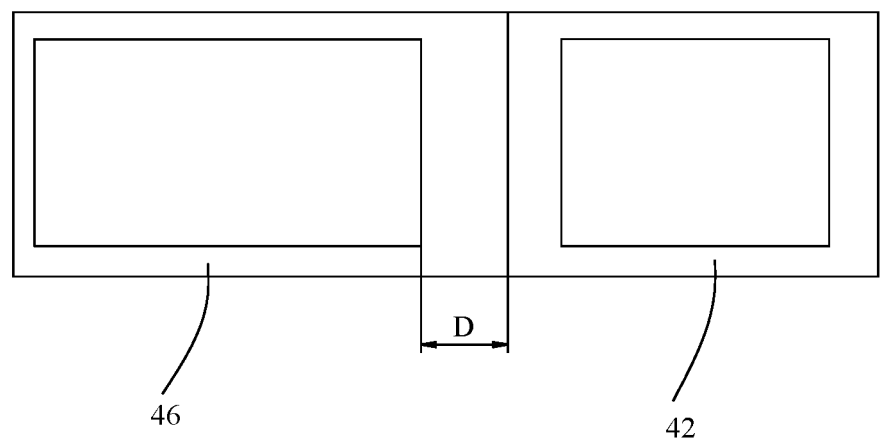
FIG. 13 is a schematic diagram of connection between a liquid return pipe and an adjacent evaporation section in a heat exchanger according to an embodiment of this application.

In another embodiment of this application, as shown in FIG. 12 and FIG. 13, the liquid return pipe 46 is connected to the adjacent evaporation section 42. A pipe wall thickness of the liquid return pipe 46 meets the following relationship:

$1 \text{ mm} \leq D \leq 2 \text{ mm}.$

Herein, D represents the wall thickness of the liquid return pipe 46 (as shown by D in FIG. 13).

Specifically, the liquid return pipe 46 is connected to the adjacent evaporation section 42, to reduce a space proportion in the heat exchanger 10 in an arrangement direction of each evaporation section 42. Therefore, the heat exchanger 10 has a smaller assembling space occupation rate. The pipe wall thickness of the liquid return pipe 46 is limited to be greater than or equal to 1 mm and less than or equal to 2 mm, so that a sufficient distance can exist between a pipe wall of the liquid return pipe 46 and a pipe wall of the adjacent evaporation section 42. Therefore, the heat exchanger 10 has a smaller assembling space occupation rate, and the evaporation section 42 can be prevented from radiating heat to the liquid return pipe 46. In this way, most of the phase change working substance in the liquid return pipe 46 returns to the liquid collection pipe 30 in the liquid state, to improve vapor-liquid cycle efficiency of the phase change working substance in the heat exchanger 10.

In another embodiment of this application, the liquid return pipe 46 is a round pipe or an oblate pipe. Specifically, the liquid return pipe 46 may be set to a round pipe or an oblate pipe. When the liquid return pipe 46 is set to a round pipe, a flowing rate of the phase change working substance in the liquid return pipe 46 can be improved, to further improve heat exchange efficiency of the heat exchanger 10. The liquid return pipe 46 is set to an oblate pipe. This facilitates integrated manufacturing of the liquid return pipe 46 and the adjacent evaporation section 42. Likewise, the evaporation section 42 may also be designed to an oblate pipe, to reduce difficulty of integrated manufacturing of the liquid return pipe 46 and the evaporation section 42.

Figure 14:
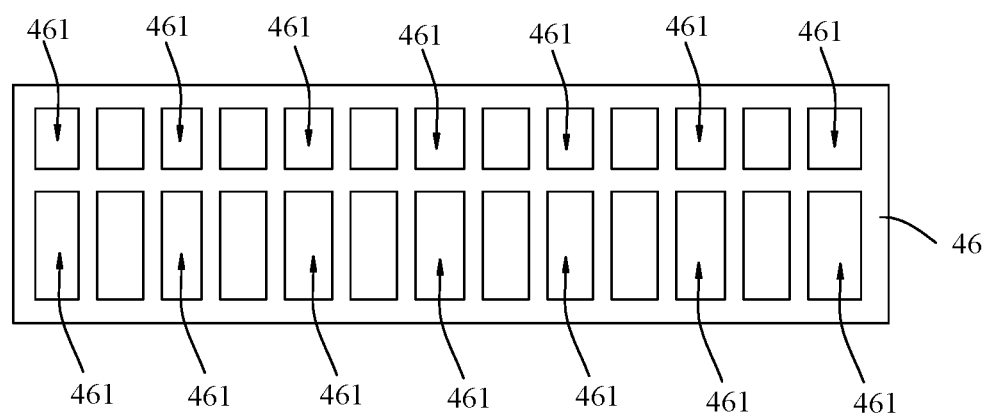
FIG. 14 is a schematic diagram of an internal structure of a liquid return pipe in a heat exchanger according to an embodiment of this application.

In another embodiment of this application, as shown in FIG. 14, two or more liquid return paths 461 are formed in the liquid return pipe 46. Specifically, two or more liquid return paths 461 are formed in the liquid return pipe 46. In this way, a plurality of independent liquid return paths 461 exist in the liquid return pipe 46. Therefore, separation is better implemented between the phase change working substance in the liquid return path 461 and the hot environment, so that most of the phase change working substance in the liquid return pipe 46 returns to the liquid collection pipe 30 in the liquid state, to improve vapor-liquid cycle efficiency of the phase change working substance in the heat exchanger 10.

The foregoing descriptions are merely example embodiments of this application, but are not intended to limit this application. Any modification, equivalent replacement, or improvement made without departing from the spirit and principle of this application may fall within the protection scope of this application.

What is claimed is:

1. A heat exchanger, comprising:
   a vapor collection pipe;
   a liquid collection pipe; and
   a first exchange pipeline, comprising a condensing section, an evaporation section, and a transition section;
   wherein an upper end of the condensing section is connected to the vapor collection pipe, and a lower end of the condensing section is connected to a first end of the transition section;
   wherein an upper end of the evaporation section is connected to a second end of the transition section, and a lower end of the evaporation section is connected to the liquid collection pipe;
   wherein the evaporation section and the condensing section respectively extend in directions opposite to each other;
   wherein an included angle $\theta_1$ between an axis of the evaporation section and an axis of the transition section meets $60° \leq \theta_1 < 180°$;
   wherein an included angle $\theta_2$ between an axis of the condensing section and the axis of the transition section meets $60° \leq \theta_2 < 180°$; and
   wherein the first exchange pipeline further comprises a vapor-liquid separation pipe, wherein the vapor-liquid separation pipe comprises a main pipe body and a porous separation board, and wherein the main pipe body is connected to the transition section and is connected to the liquid collection pipe, the porous separation board is disposed in the main pipe body along an axis of the main pipe body, the porous separation board separates space in the main pipe body into a vapor aggregation cavity and a liquid aggregation cavity, the vapor aggregation cavity is connected to the vapor collection pipe, and the liquid aggregation cavity is connected to the liquid collection pipe.

2. The heat exchanger according to claim 1, wherein the evaporation section, the transition section, and the condensing section are formed through bending a pipe.

3. The heat exchanger according to claim 1, wherein the heat exchanger comprises a plurality of exchange pipelines, including the first exchange pipeline, wherein an upper end of each condensing section of the plurality of exchange pipelines is connected to the vapor collection pipe, a lower end of one condensing section of the plurality of exchange pipelines is connected to a first end of one transition section of the plurality of exchange pipelines, an upper end of one evaporation section of the plurality of exchange pipelines is connected to a second end of the one transition section, and a lower end of each evaporation section of the plurality of exchange pipelines is connected to the liquid collection pipe.

4. The heat exchanger according to claim 3, wherein the vapor-liquid separation pipe of the first exchange pipeline is connected to each transition section of the plurality of exchange pipelines, and the vapor-liquid separation pipe is configured to separate a phase change working substance in each transition section of the plurality of exchange pipelines into a vapor phase change working substance and a liquid phase change working substance.

5. The heat exchanger according to claim 1, wherein the heat exchanger further comprises a rising pipe, wherein one end of the rising pipe is connected to the vapor aggregation cavity, and the other end of the rising pipe is connected to the vapor collection pipe.

6. The heat exchanger according to claim 5, wherein the heat exchanger further comprises a dropping pipe, wherein one end of the dropping pipe is connected to the liquid aggregation cavity, and the other end of the dropping pipe is connected to the liquid collection pipe.

7. The heat exchanger according to claim 6, wherein the liquid collection pipe, the vapor-liquid separation pipe, the evaporation section of the first exchange pipeline, the condensing section of the first exchange pipeline, the transition section of the first exchange pipeline, the rising pipe, and the dropping pipe are integrally welded.

8. The heat exchanger according to claim 1, wherein the heat exchanger further comprises a separation board, wherein the transition section of the first exchange pipeline penetrates the separation board, wherein the evaporation section of the first exchange pipeline and the liquid collection pipe are located on one side of the separation board, and wherein the condensing section of the first exchange pipeline and the vapor collection pipe are located on the other side of the separation board.

9. The heat exchanger according to claim 8, wherein the separation board comprises a first separation board and a second separation board, wherein the first separation board and the second separation board are both disposed along an axis of the vapor-liquid separation pipe, and an edge of the first separation board and an edge of the second separation board are separately connected to outer walls of two opposite sides of the vapor-liquid separation pipe.

10. The heat exchanger according to claim 1, wherein the included angle $\theta_1$ between the axis of the evaporation section and the axis of the transition section meets $60° \leq \theta_1 \leq 90°$.

11. The heat exchanger according to claim 1, wherein the included angle $\theta_2$ between the axis of the condensing section and the axis of the transition section meets $60° \leq \theta_2 \leq 90°$.

12. The heat exchanger according to claim 1, wherein fins are disposed on an outer wall of the evaporation section and/or an outer wall of the condensing section.

13. The heat exchanger according to claim 1, wherein the heat exchanger further comprises a liquid return pipe, wherein one end of the liquid return pipe is connected to the vapor collection pipe, and the other end of the liquid return pipe is connected to the liquid collection pipe.

14. The heat exchanger according to claim 13, wherein a heat insulation part is disposed on an outer periphery of the liquid return pipe.

15. The heat exchanger according to claim 14, wherein the heat insulation part is a heat insulation board, and the heat insulation board is disposed between the liquid return pipe and the adjacent evaporation section.

16. The heat exchanger according to claim 13, wherein the liquid return pipe is connected to the adjacent evaporation section, and a pipe wall thickness D of the liquid return pipe meets $1 \text{ mm} \leq D \leq 2 \text{ mm}$.

17. The heat exchanger according to claim 13, wherein the liquid return pipe is a round pipe or an oblate pipe.

18. A cabinet, comprising:
a cabinet body; and
a heat exchanger, comprising:
    a vapor collection pipe;
    a liquid collection pipe; and
    an exchange pipeline, comprising a condensing section, an evaporation section, and a transition section;
wherein an upper end of the condensing section is connected to the vapor collection pipe, and a lower end of the condensing section is connected to a first end of the transition section;
wherein an upper end of the evaporation section is connected to a second end of the transition section, and a lower end of the evaporation section is connected to the liquid collection pipe;
wherein the evaporation section and the condensing section respectively extend in directions opposite to each other;
wherein an included angle $\theta_1$ between an axis of the evaporation section and an axis of the transition section meets $60° \leq \theta_1 < 180°$;
wherein an included angle $\theta_2$ between an axis of the condensing section and the axis of the transition section meets $60° \leq \theta_2 < 180°$;
wherein the vapor collection pipe and the condensing section of the heat exchanger are located outside the cabinet body, and the liquid collection pipe and the evaporation section of the heat exchanger are located inside the cabinet body; and
wherein the exchange pipeline further comprises a vapor-liquid separation pipe, wherein the vapor-liquid separation pipe comprises a main pipe body and a porous separation board, and wherein the main pipe body is connected to the transition section and is connected to the liquid collection pipe, the porous separation board is disposed in the main pipe body along an axis of the main pipe body, the porous separation board separates space in the main pipe body into a vapor aggregation cavity and a liquid aggregation cavity, the vapor aggregation cavity is connected to the vapor collection pipe, and the liquid aggregation cavity is connected to the liquid collection pipe.

19. The cabinet according to claim 18, wherein the cabinet is part of a communications base station.

* * * * *